United States Patent [19]

Hemmie

[11] Patent Number: 4,791,717

[45] Date of Patent: Dec. 20, 1988

[54] INTERDIGITAL FILTER APPARATUS AND METHOD FOR CONSTRUCTION

[75] Inventor: Dale L. Hemmie, Burlington, Iowa

[73] Assignee: Conifer Corporation, Burlington, Iowa

[21] Appl. No.: 102,726

[22] Filed: Sep. 30, 1987

[51] Int. Cl.[4] ........................ H01P 11/00; H05K 5/06

[52] U.S. Cl. ...................................... 29/600; 361/394; 361/395; 361/399; 174/52.1; 174/52.3

[58] Field of Search ........................ 361/399, 395, 394; 29/600; 174/52 R, 52 S, 52 FP

[56] References Cited

U.S. PATENT DOCUMENTS

| | | | |
|---|---|---|---|
| 3,721,746 | 3/1973 | Knappenberger | 174/52 R X |
| 4,190,735 | 2/1980 | Checki, Jr. | 174/52 FP |
| 4,399,487 | 8/1983 | Neumann | 361/399 X |
| 4,680,676 | 7/1987 | Petratos et al. | 361/399 X |
| 4,701,728 | 10/1987 | Igarashi | 29/600 |

FOREIGN PATENT DOCUMENTS 3006146 8/1981 Fed. Rep. of Germany .... 174/52 R

OTHER PUBLICATIONS

MTV/82 Price List, Dec. 15, 1983, Microwave Filter Company, Inc.

Ham Radio Magazine, Jan. 1985.

*Primary Examiner*—Howard N. Goldberg
*Assistant Examiner*—Carl J. Arbes
*Attorney, Agent, or Firm*—Dorr, Carson, Sloan & Peterson

[57] ABSTRACT

An integrated down converter and interdigital filter apparatus having a down converter and the interdigital filter mounted on the same printed circuit board and installed in the watertight housing. The housing of the interdigital filter is cut from sheet metal and a conductive surface on the printed circuit board as one side. A method for construction of the interdigital filter is also set forth.

5 Claims, 9 Drawing Sheets

INTERDIGITAL FILTER APPARATUS AND METHOD FOR CONSTRUCTION

BACKGROUND OF THE ART

1. Field of the Invention

The present invention relates to microwave down converters and interdigital filters and, more particularly, to the combining of the interdigital filter into the down converter and the method for constructing the integrated combination.

2. Discussion of Prior Art

Various types of down converters are readily available for converting microwave signals such as in the range of frequencies from 2150 to 2162 MHz (MDS) and 2500 to 2686 MHz (ITFS) received by an appropriate antenna such as an MDS antenna to a corresponding electrical signal for delivery to a receiver. A conventional down converter for an MDS antenna is of the type manufactured by Conifer Corporation, P.O. Box 1025, Burlington, Iowa 52601, available as the QL Series.

Conventional down converters generally use two types of integrated filters. The first type of integrated band pass filter is a printed filter and the second type is a dual cavity filter. While such filters function adequately for single channel MDS applications, they do not function adequately in multiple channel situations.

Interdigital filters exhibiting greater IF rejection, better out-of-band rejection and lower in-band insertion loss than printed and dual cavity filters are commercially available for use with down converters. The theoretical basis for the design of interdigital filters is well known as set forth in the article by Jerry Hinshaw and Shahrokh Monemzadeh, "Computer-Aided Interdigital Bandpass Filter Design." Ham Radio Magazine, January 1985, Pages 12-26. Such interdigital filters, however, are available only as separate circuits and, therefore, require a separate housing and a separate jumper cable to interconnect the interdigital filter with the down converter. Both the interdigital and the down converter are placed near the antenna in the outside environment thereby necessitating a waterproof housing for each. The provision of a separate waterproof housing for the interdigital filter is expensive. Likewise, the provision of a jumper cable not only adds to the cost, but also degrades the signal as well as provide an impedance mismatching problem.

Furthermore, a conventional interdigital filter such as those available from Microwave Filter Company, Inc., 6743 Kinne St., East Syracuse, N.Y. 13057 as Model No. 3746 are expensive to manufacture generally requiring machined components. For example, the interdigital filter Model No. 3746 for MDS applications from Microwave Filter is commercially available at prices from $95 to $135. The Conifer Down Converter is also commercially available at about a price of $80. The combined price with a $10 jumper cable would be about $185 for the two separate units. Under the teachings of the present invention, the integration of the interdigital filter into the down converter would result in a price of about $100.

SUMMARY OF THE INVENTION

A problem with using the existing separate down converter and separate interdigital filter relates to the provision of the separate waterproof housing for the interdigital filter, the requirement for a separate jumper cable for interconnection, and the overall expense of providing an interdigital filter composed of machined parts.

The present invention solves these problems by integrating the interdigital filter into the down converter thereby eliminating the need for a separate waterproof housing and the need for an interconnecting jumper cable. The present invention also provides a method for constructing the interdigital filter from sheet metal using a die stamp to cut out the various components of the interdigital filter. Four sides of the housing are constructed from the sheet metal whereas the fifth side of the housing comprises a ground plane deposited on a PC board of the down converter and the last side is also a separate cut piece from sheet metal. Once the mill stock is stamped out, the resulting cut-pieces are formed into the proper housing configuration.

The elements of the interdigital filter are then inserted into the housing, aligned, and permanently affixed thereto. The filter is then tuned for proper operation.

The integrated down converter and interdigital filter of the present invention and the method for constructing the integrated combination results in a device that competes, in cost, with conventional integrated band pass filters (i.e., printed filters and dual cavity filters) of much lower performance.

DETAILED DESCRIPTION a. General Description

Figure 1:
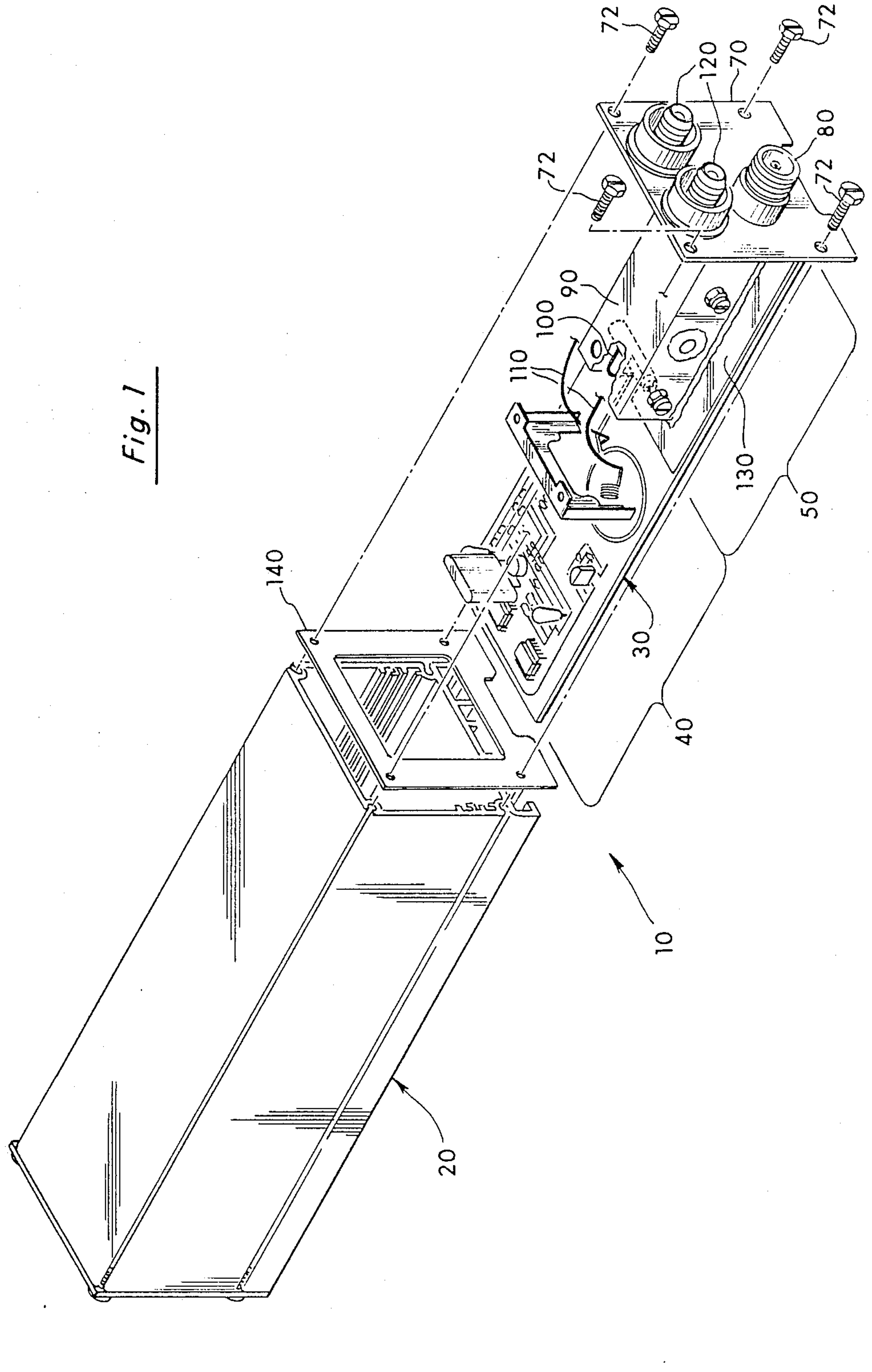
FIG. 1 is an exploded perspective view showing the major components of the integrated down converter and interdigital filter of the present invention.

In FIG. 1, the integrated down converter and interdigital filter of the present invention 10 is shown to include a waterproof housing 20, a single circuit board 30 containing a portion of the down converter section 40 and the interdigital filter section 50. A jack plate 70 is shown which interconnects to the waterproof housing 20 by means of screws 72. The microwave signal coming into the down converter from the antenna, not shown, is received through the N-connector 80 for delivery into the interdigital filter housing 90 which is then filtered in a predetermined bandwidth such as 2500–2686 MHz by the interdigital filter and delivered to lead 100 for processing by the down converter section 40. The resulting electrical output signals from the down converter which corresponds to the filtered microwave signals are then delivered to the output connectors 120. A portion of the interdigital filter 90 is the ground plane 130.

Under the teachings of the present invention, the interdigital filter section 50 is incorporated onto the printed circuit board carrying the conventionally available down converter section 40 and is mounted into the waterproof housing 20. The jack plate 70 mounts over the jack plate gasket 140 which is preferably a closed-cell light density neoprene material. When screws 72 are connected, the combined down converter and interdigital filter is securely protected within the waterproof housing 20.

Figure 3:
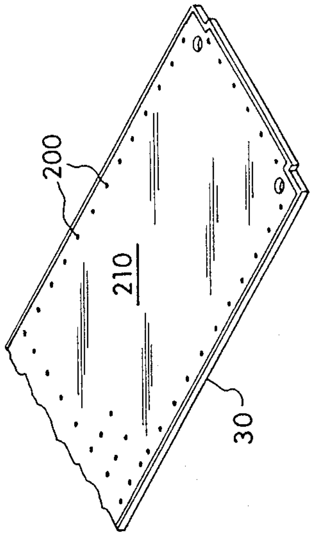
FIG. 3 is a partial perspective view, cutaway, of the opposite side of the printed circuit board of FIG. 2.
Figure 2:
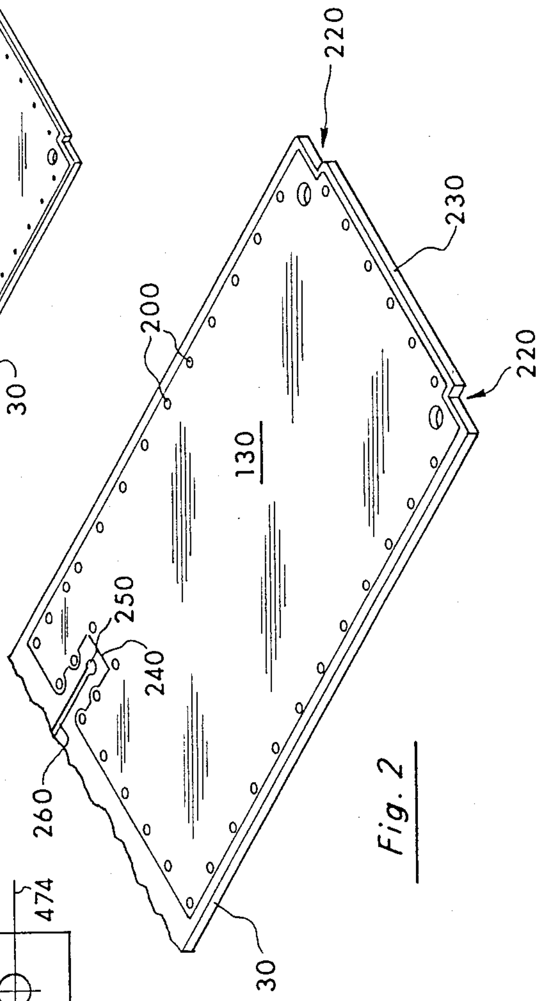
FIG. 2 is a partial perspective view of the portion of the down converter printed circuit board dedicated to receiving the interdigital filter of the present invention.

In FIG. 2, the down converter printed circuit board 30 is shown. This circuit board is preferably manufactured from 1/16th inch double-clad fiberglass epoxy board. The silver cladding on board 30 is etched away to define the rectangular ground pad 130. The ground plane conductive surface or pad 130 has a plurality of holes 200 formed around the outer periphery thereof which provides conductive paths to the opposite side of board 30, designated 210 in FIG. 3. The opposite side of board 30, as shown in FIG. 3, also has a ground pad 210 etched to remain in place directly under surface 130. The formed conductive holes 200 insure that ground potential is maintained throughout pad 130. The circuit board 30 has indents 220 formed on end 230 for mounting to the jack plate 70. Likewise, a formed U-shaped indent 240 is formed in the ground plane pad 130 in order to provide an area to place a conductive pad 250 and lead 260 to which wire 100 from the interdigital filter 90 is connected. Lead 260 delivers the signal from the interdigital filter into the down converter circuitry 40 in a conventional fashion.

Figure 4:
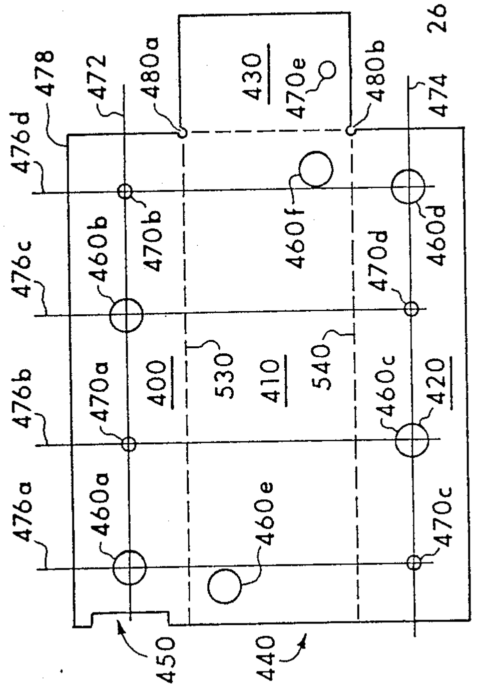
FIG. 4 is a top planar view of the first cut piece of the present invention comprising four sides of the interdigital filter housing.

In FIG. 4, four sides of the housing 90 for the interdigital filter are shown. These sides are designated 400, 410, 420, and 430. The piece 440 containing these sides is cut out of sheet metal through a blanking process. A die, not shown, is created to cut the sheet metal in the form shown in FIG. 4. Side 400 has an indent 450 cut out and whose function will be explained later. In addition, side 400 has two cut out holes 460*a* and 460*b* which are each 0.218 inches in diameter. Likewise, side 400 has two formed holes 470*a* and 470*b* which are each cut to a 0.089 inch diameter. Holes 460 and 470 are equally spaced apart along line 472. Likewise, opposing side 420 has holes 460*c*, 460*d*, 470*c*, and 470*d* equally spaced along line 474. The holes on side 400 directly oppose the holes on side 420 as indicated by lines 476*a* through 476*d*. Line 472 is 0.375 inches from surface 478 whereas line 474 is 2.267 inches from surface 478 in the preferred embodiment. On side 410 are located two holes 460*e* and 460*f* oriented in opposing corners on side 410. Finally, side 430 has a cut hole 470*e* centrally located on the edge near side 420. In addition, small cut-aways 480*a* and 480*b* are provided at the junction between side 430 and sides 400 and 420. Under the teachings of the present invention, the die, not shown, cuts out four sides of housing 90 as a single piece 440 as shown in FIG. 4. All holes 460 and 470 are cut and all excess material is removed. The material used is preferably 0.0159 inch one-half hard brass. Holes 470*a*, 470*b*, 470*c*, and 470*d* are then threaded.

Figure 5:
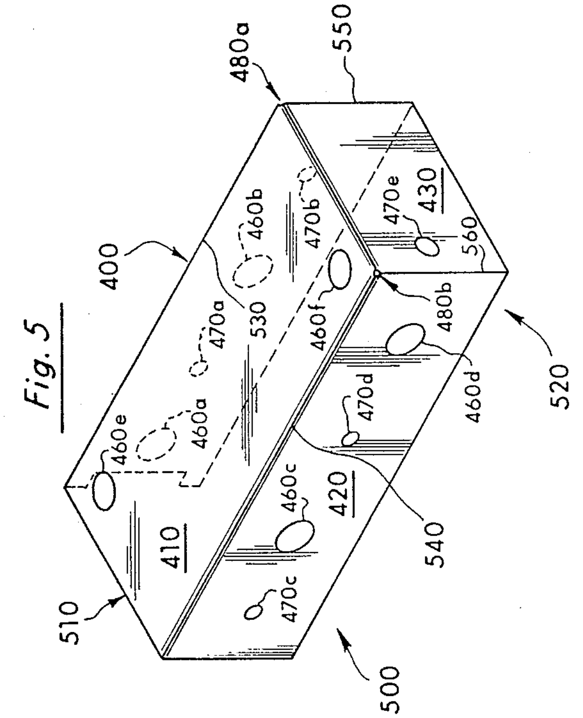
FIG. 5 is a perspective view of the cut piece of FIG. 4 formed into the shape of the housing of the present invention.

In FIG. 5, the piece 440 of FIG. 4 is formed into the housing 440 shown in FIG. 5. The housing 500 has an open end 510 and an open bottom 520. The housing 500 is formed by bending piece 440 as shown in FIG. 4 along lines 530 and 540 with a forming machine. A butt seam is also formed at corners 480*a* and 480*b*. In the forming process, ends 550 and 560 simply abutt together.

Figure 6:
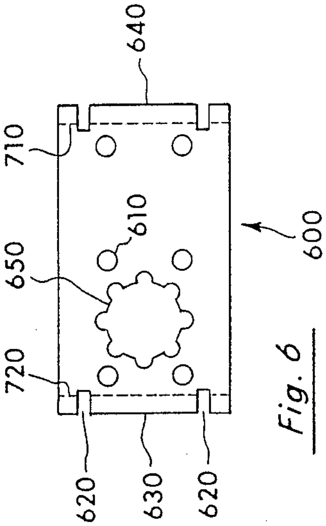
FIG. 6 is a top planar view of the second cut piece of the present invention.

In FIG. 6, the details of the jack plate bracket 600 are shown. The jack plate bracket 600 is also cut out from sheet metal stock into the shape and configuration shown in FIG. 6. In FIG. 6, the rectangular shaped piece formed is cut from 0.0159 inch one-half hard brass stock. Six holes 610 are cut therein. Each of these holes preferably is 0.125 inches in diameter and are designed to receive rivets as will be subsequently explained. Likewise, four indents 620 are cut in opposing sides 630 and 640 of 600.

Finally, the substantially circular hole 650 is cut from piece 600 to receive the N-connector 80 as shown in FIG. 1. Hole 650 is 0.500 inch hole with 0.063 inch notches cut out at 45 degree points around the edge.

Figure 7:
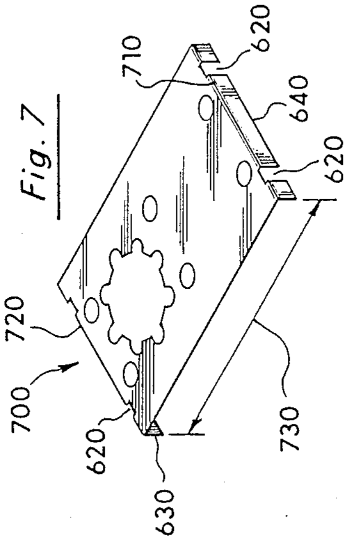
FIG. 7 is a perspective view showing the cut piece of FIG. 6 formed into its bracket shape.

As shown in FIG. 7, piece 600 is bent in the shape of formed piece 700 along lines 710 and 720. The distance 730 between edges 630 and 640 in the preferred embodiment is 1.750 inches.

Figure 9:
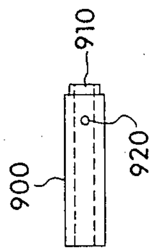
FIG. 9 is a side planar view of an end element of the present invention.
Figure 8:
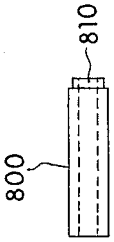
FIG. 8 is a side planar view of an interior element of the present invention.

In FIGS. 8 and 9 are shown the details of the elements of the interdigital filter 90 of the present invention. In FIG. 8, is shown the interior element 800 which is cut from copper tubing having a 0.250 inch outer diameter with a 0.031 inch wall thickness. In FIG. 8, element 800 is typically 1.00 inches long having an annular region 810 which is typically 0.062 inches deep. A conventional screw machine is used to form annular region 810. It can also be formed by turning on a lathe. Likewise, in FIG. 9, the end element 900 is preferably 1.1017 inches long also having an annular region 910 which is also set back 0.062 inches. A hole 920 is cross drilled through element 900.

Figure 10:
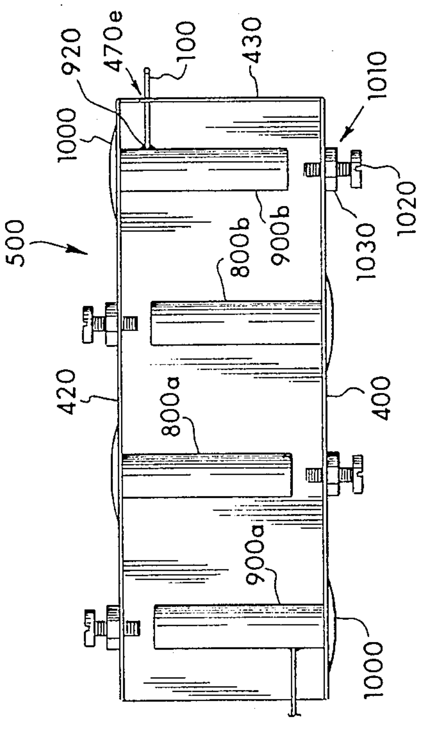
FIG. 10 is a bottom planar view of the housing of FIG. 4 with the elements of FIGS. 8 and 9 attached therein.

In FIG. 10, the bottom planar view of the formed housing 500 is shown with tuning elements 800 and 900 mounted therein. The spatial location of these tuning elements is made according to the teachings of Hinshaw, et al. supra. In FIG. 10 each element is soldered to the side of the housing as indicated by 1000. Each element has associated with it and directly opposite from it a tuning screw assembly 1010 comprising a tuning screw 1020, and a nut 1030. Elements 800 and 900 are mounted through the formed holes 460 whereas the screws 1020 are mounted through the formed and threaded holes 470. Wire 100 is soldered to end element 900*b* through hole 470*e*. In the preferred embodiment nut 1030 located on the outside of the housing 500 is tightened after the elements are tuned to firmly hold the screws 1020 which are threaded into hole 470. The arrangement of the tuning elements and the tuning screws are conventional.

Figure 11:
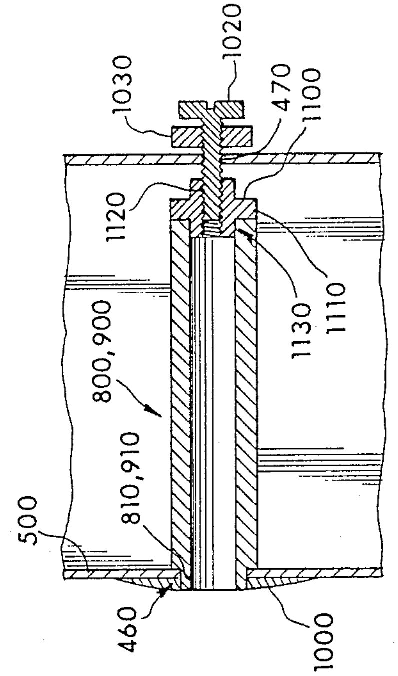
FIG. 11 illustrates the alignment of an element for attachment to the housing.

In FIG. 11, the element 800 or 900 is inserted into hole 460 of the formed housing 500. A threaded collar 1100 is placed into the interior of the element 800, 900. Collar 1100 has a lip 1110 which abuts against end 1130. The collar 1100 in turn is threaded 1120 to receive the threaded end of screw 1020. The screw is then tightened into the collar 1100 so that the screw 1020, and the collar 1100 firmly holds end 1130 of the element 800, 900. In this arrangement, the element is in perfect alignment and solder 1000 can now be applied. In other words, the steps in assembling the element 800, 900 to the formed housing 500 are as follows:

1. Place the annular end 810, 910 of an element 800, 900 into the cut hole 460 of the formed housing.
2. Insert the collar 1100 into the end 1130 of the element.
3. Insert the threaded end of screw 1020 into the opposite end of the collar 1100 to firmly hold the element 800, 900 in place.
4. Apply the solder 1000 over the annular end of the element.
5. Loosen the screw 1020.
6. Remove the collar 1100.

It is to be expressly understood that this is one preferred method of installing the elements into the formed housing. In another approach, the annular region 810, 910 of an element 800, 900 rather than being soldered can be riveted, by curling end 810, 910 over with an anvil tool in a conventional fashion, to housing 500.

Figure 12:
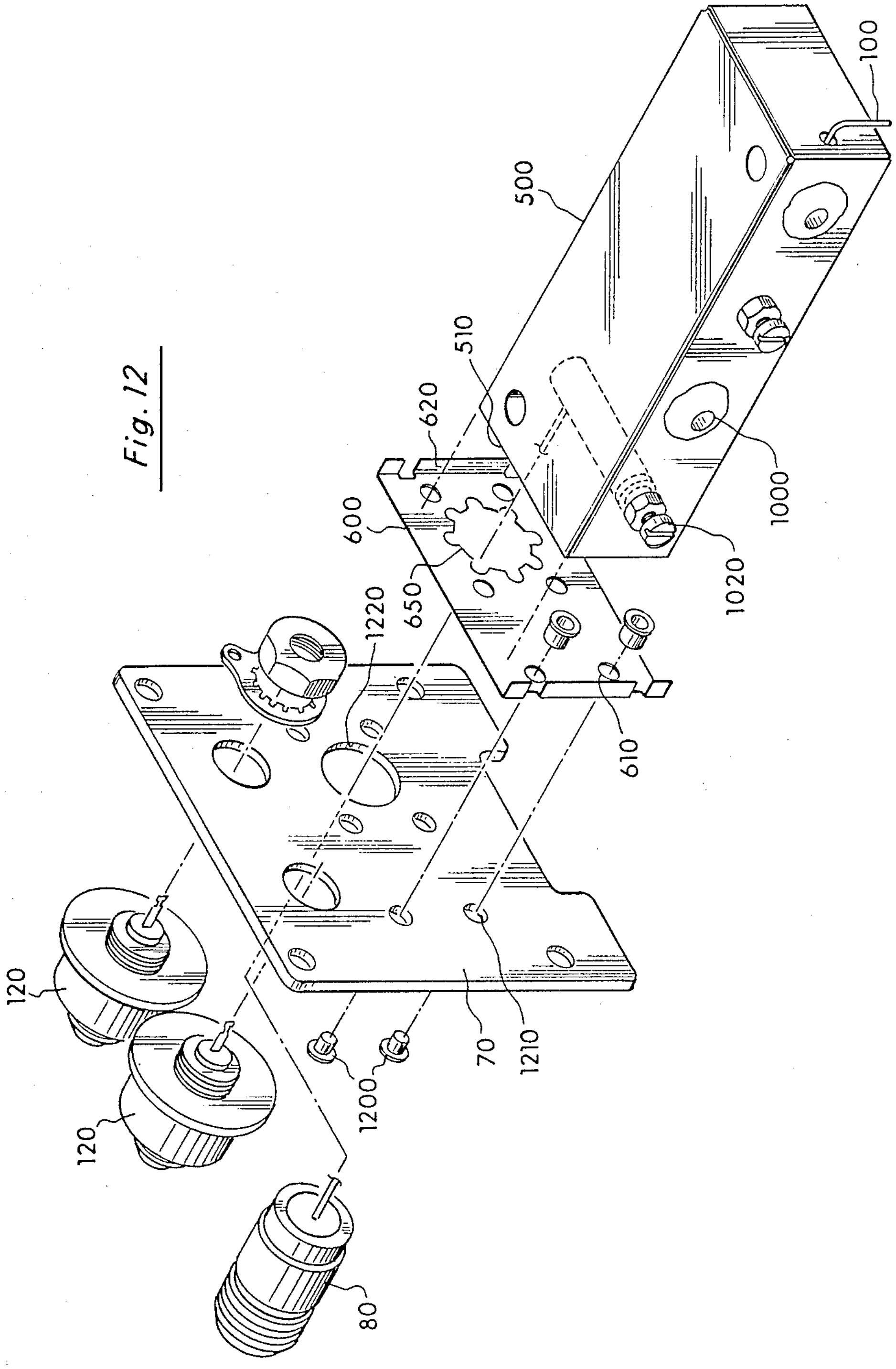
FIG. 12 is an exploded perspective view showing the assembly of the housing to the jack plate.
Figure 13:
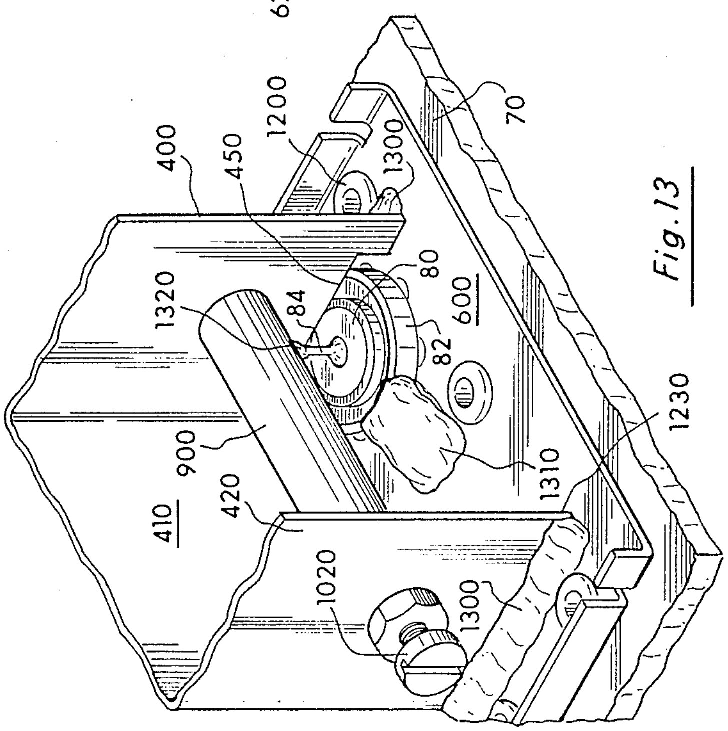
FIG. 13 is a partial perspective view showing the soldered connection of the housing to the jack plate bracket.

In FIG. 12, the housing 500 containing the assembled elements is mounted to the jack plate 70. This occurs in the following fashion. First, the jack plate bracket 600 is mounted to the jack plate 70 by means of rivets of 1200 of the jack plate through holes 1210 and through holes 610 of the jack plate bracket 600. The jack plate bracket is then firmly riveted by means of the six rivets 1200 to the jack plate 70. The N-connector 80 is then inserted through formed hole 1220 of the jack plate and through the cut hole 650 of the jack plate bracket. The open end 510 of the housing 500 is then mounted to the jack plate bracket 600 as shown in FIG. 13. The open end 510 is placed against the surface of the jack plate bracket 600 and the end 1230 is soldered 1300 all along the edge 1230 on sides 420, 410, and 400. This firmly holds the housing to the jack plate 600 which is in turn riveted to the jack plate 70. The outer conductor 82 of the N-connector 80 is also soldered 1310 to the jack plate bracket 600. The center conductor 84 of the N-connector 80 is then soldered 1320 to the terminal element 900 (i.e., the element nearest the jack plate) at hole 920. In this fashion, the interdigital filter of the present invention is firmly attached to the jack plate 70. The remaining connecters 120 can then be added to the jack plate 70 in a conventional fashion.

Figure 14:
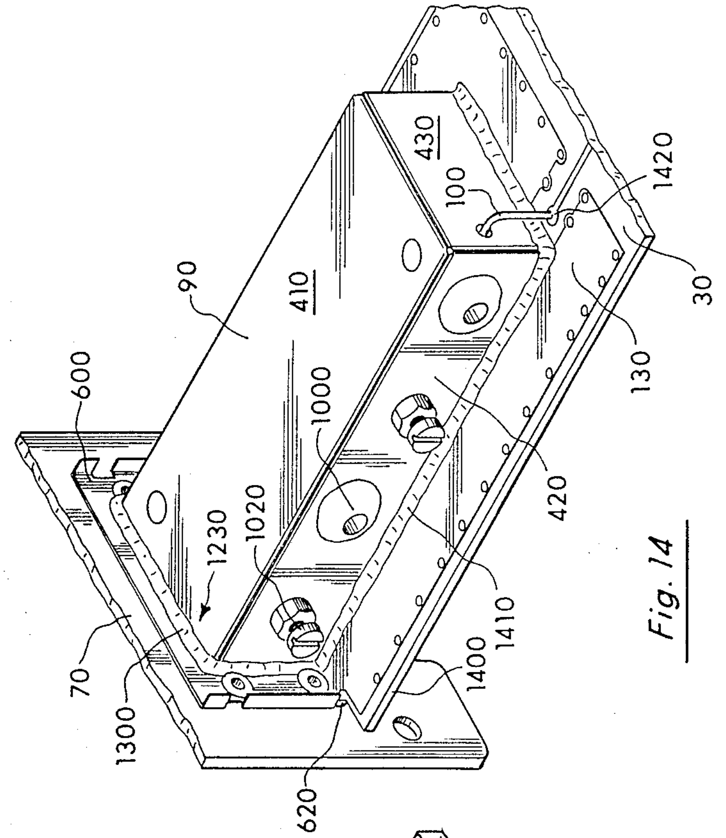
FIG. 14 is a partial perspective view showing the soldering of the housing to the printed circuit board of the down converter.

The final assembly of the housing to the down converter is shown in FIG. 14 whereby the jack plate carrying the jack plate bracket 600 with the housing 90 extending therefrom is placed over the circuit board 30 to rest the open bottom on the ground plane conductive surface 130 as shown in FIG. 14. The end 1400 of the circuit board 30 engages the formed slots 620 of the bracket 600. The open end of the housing 90 is then soldered 1410 all the way around the outer periphery of the housing 90 to affix the housing to the surface in order to fully enclose the interior of said housing in a conductive envelope whose potential is at ground as shown in FIG. 14. Lead 100 is soldered to the pad 250 to electrically interconnect with the conventional down converter circuit 40. As shown in FIG. 10, the farthest element from the jack plate is interconnected with lead 100 and lead 100 carries the filtered microwave signal in the desired bandwidth.

The interdigital filter 90 can now be tuned by adjustment of the screws 1020 to obtain the desired performance. This tuning occurs in a conventional fashion.

Figure 15:
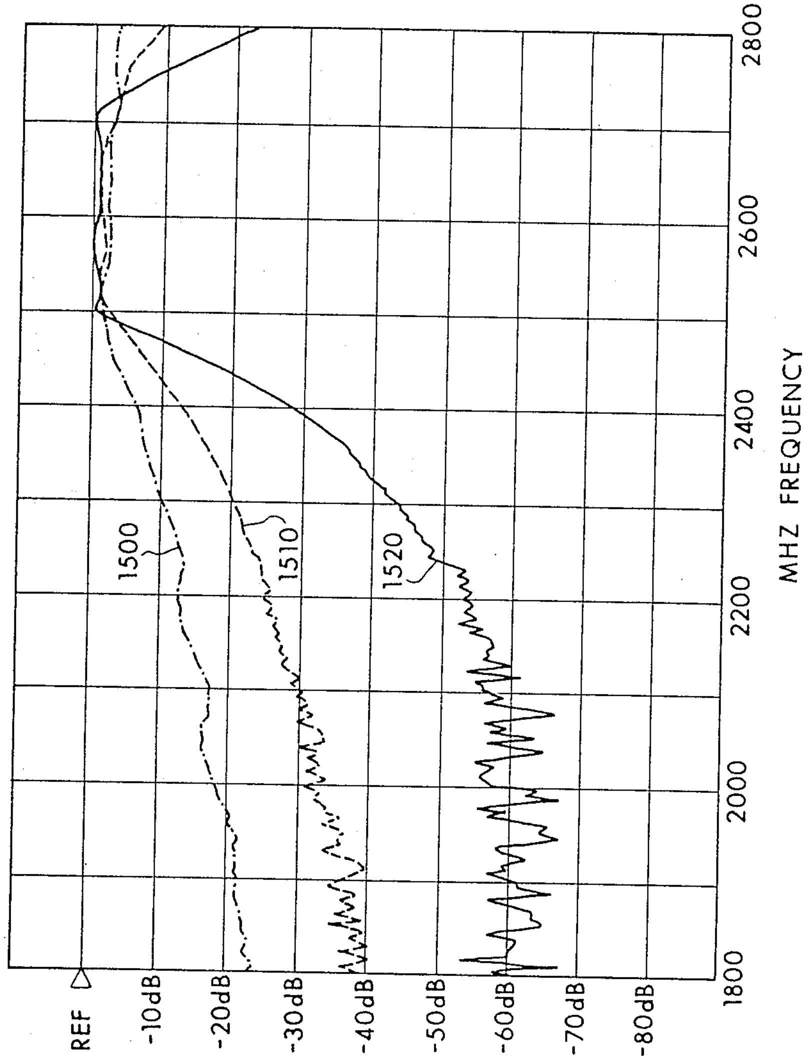
FIG. 15 graphically illustrates the bandwidth performance of the integrated interdigital filter of the present invention.
Figure 16:
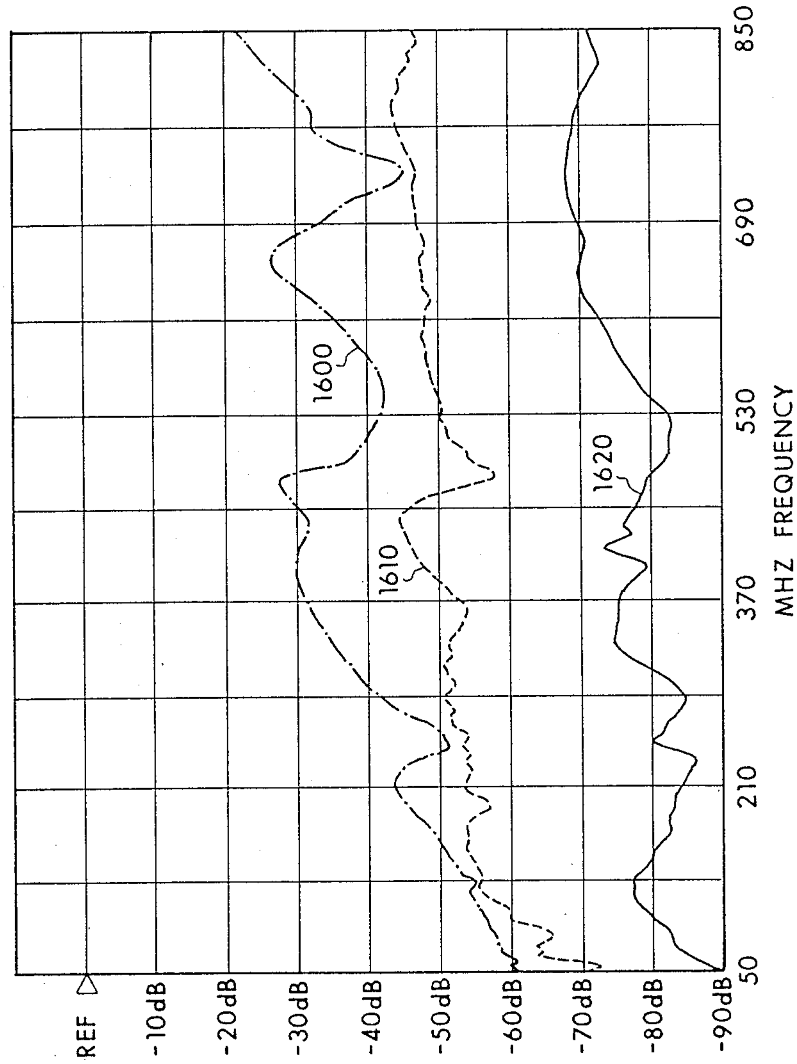
FIG. 16 graphically illustrates the IF rejection of the integrated interdigital filter of the present invention.

In FIGS. 15 and 16 are shown the performance of the integrated filter of the present invention designed for the ITFS range of frequencies of 2500 to 2686 MHz in comparison to printed filters or integrated dual cavity filters for the same range of frequencies.

In FIG. 15, the band pass for the interdigital filter described above is shown. Note that the band pass is from 2500 MHz to 2686 MHz. Curve 1500 is for a printed filter, curve 1510 is for a dual cavity filter, and curve 1520 is for the filter of the present invention. This curve shows the sharp band pass for the filter of the present invention. The reference line REF is more closely obtained by the interdigital filter thereby showing a lower insertion loss of this filter when compared to the other two filters. The one to three dB lower insertion loss improves the noise figure by a like amount. In addition, the interdigital filter quickly drops from the reference point to a minus 60 db level. When compared to the printed and dual cavity filters, the image frequencies are down 25–40 dB. Hence, the image frequencies of 2056 MHz and 1870 MHz are much better suppressed with the interdigital filter of the present invention.

In FIG. 16, the IF rejection of the present invention is compared to the dual cavity and printed filters. The curve for the printed filters shown is 1600, the curve for the dual cavity is shown as 1610, and the curve for the interdigital filter of the present invention is shown as 1620. It is to be noted that the interdigital filter 1620 curve is approximately 20 to 30 db below that of the dual cavity filter. I.F. rejection is improved for three reasons: (1) the extremely high selectivity characteristics of the interdigital filter of the present invention; (2) the fully enclosed filter allows little leakage of VHF frequencies; and (3) the center conductor 84 of the N-connector 80 is virtually shorted to ground at VHF frequencies due to its tap point 1320 on element 900*a*.

Figure 17:
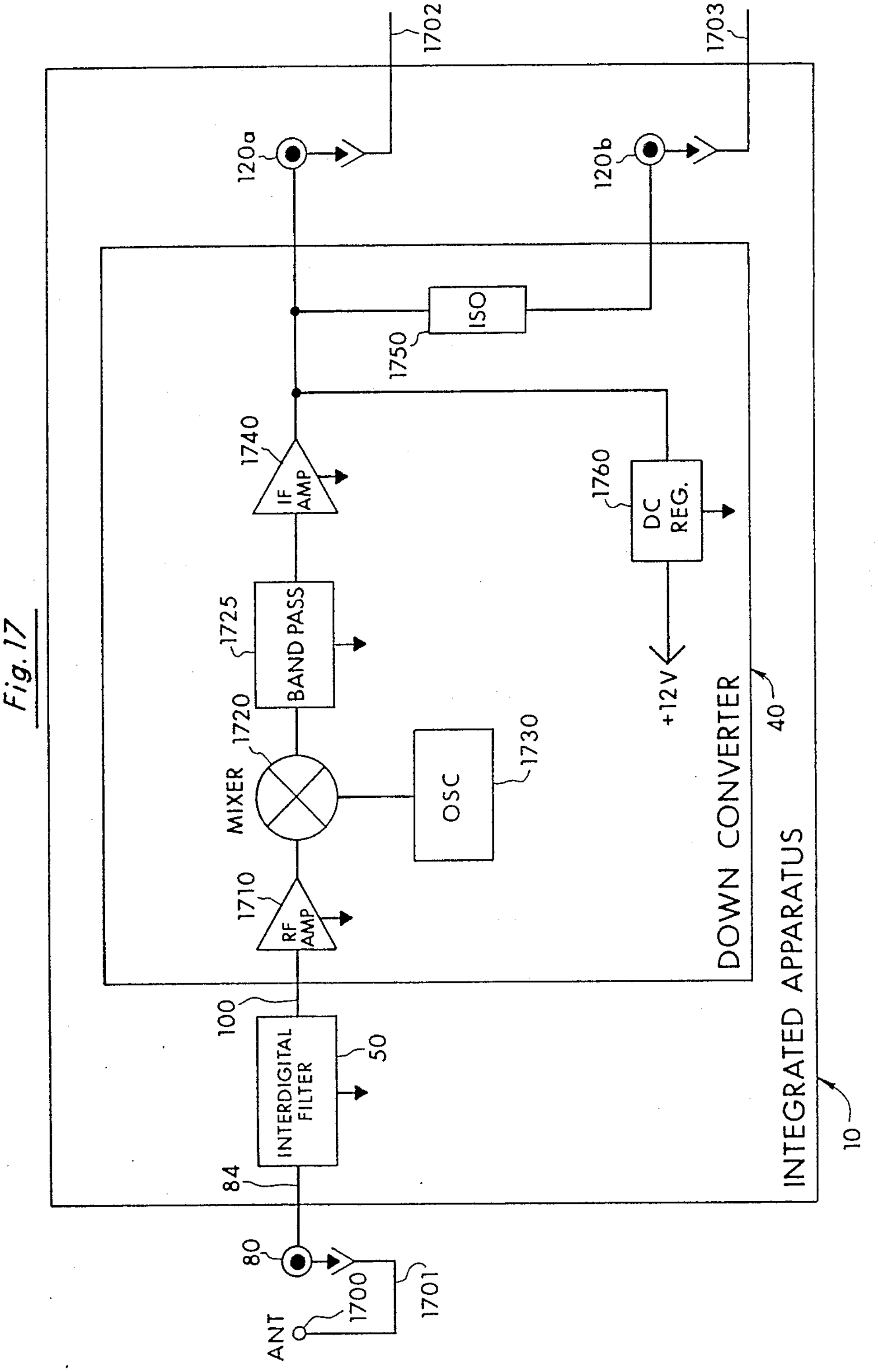
FIG. 17 is a block diagram schematic of the integrated down converter interdigital filter of the present invention.

In FIG. 17, the block diagram schematic of the integrated down converter interdigital filter 10 of the present invention is shown interconnected with a microwave antenna 1700 over cable 1701 to the N-connector 80. The electrical signal output of the present invention 10 is delivered from connector 120*a* and 120*b* over cables 1702 and 1703. The interdigital filter 50 receives the microwave signal from the N-connector 80 over lead 84 and filters the signal for delivery to lead 100 in the desired bandwidth. Lead 100 inputs the signal to a conventional down converter 40 which processes the signal as follows. The signal on lead 100 is delivered into an RF low noise amplifier 1720 which delivers the amplified signal to mixer 1720 which is driven by local oscillator 1730 (e.g., 2278 MHz). The output of mixer 1720 is filtered by a band pass filter 1725 (e.g., 222 MHz to 408 MHz) for delivery to an I.F. amplifier 1740. The I.F. amplifier delivers the electrical output signal to connector 120*a* and to an isolation network 1750 for delivery to connector 120*b*. The cable that carries the output signal from the I.F. amplifier also is used to carry power from the DC regulator to other sections of the down converter circuitry.

Finally, the cost of constructing the high performance integrated interdigital filter of the present invention is significantly less than that of a separate interdigital filter in its own waterproof housing. The cost of the interdigital filter of the present invention is about $20. The reason for this low cost is due entirely to the integration of the filter onto the down converter board (thereby eliminating the costly jumper cable, waterproof housing, and associated mounting hardware). The unique manner of construction for the filter also lowers costs, being stamped and formed sheet metal brass to create the filter housing 500 and to use the printed circuit board itself as one side of the filter housing.

While a preferred embodiment of the present invention has been shown for the ITFS bandwidth, it is expressly understood that an integrated down converter interdigital filter for the MDS bandwidth could also be constructed under the teachings of the present invention. Furthermore, it is to be expressly understood that modifications and changes may be made thereto and that the present invention is set forth in the following claims.

I claim:

1. An integrated down converter interdigital filter apparatus receptive of a microwave signal for producing an electrical output signal in a predetermined bandwidth corresponding to said microwave signal comprising:

a watertight housing, said watertight housing comprising:

(a) a housing having one end open, and (b) means for engaging said open end of said housing to provide a watertight seal, a printed circuit board, a down converter located on said board, an interdigital filter also located on said board, said interdigital filter comprising:

(a) a ground plane conductive surface formed on said board, (b) a conductive rectangular housing having its bottom open, said housing having said open bottom affixed to said conductive surface in order to fully enclose the interior of said housing, (c) a plurality of elements spatially located in said housing for filtering said microwave signal in said predetermined bandwidth, (d) means connected through said housing for interconnecting said microwave signal with the nearest element of said plurality of elements, means connected through said housing and connected to the element farthest from the aforesaid element connected to said microwave signal for interconnecting the filtered signal in said bandwidth from said interdigital filter to the input of said down converter, and means connected to the output of said down converter for delivering said electrical signal output from said watertight housing.

2. An integrated down converter interdigital filter apparatus receptive of a microwave signal for producing an electrical output signal in a predetermined bandwidth corresponding to said microwave signal comprising:

a watertight housing, said watertight housing comprising:

(a) a housing having one end open, (b) means for sealing around said opening, and (c) means for engaging said sealing means and said open end of said housing to provide a watertight seal, a printed circuit board, a down converter located on said board, an interdigital filter also located on said board, said interdigital filter comprising:

(a) a ground plane conductive surface formed on said board, (b) a conductive rectangular housing having its bottom open, said housing having said open bottom affixed to said conductive surface in order to fully enclose the interior of said housing, (c) one end of said housing being connected to said engaging means, (d) a plurality of elements spatially located in said housing for filtering said microwave signal in said predetermined bandwidth, and (e) means connected to said engaging means and to said connected end of said housing for interconnecting said microwave signal with the element nearest said engaging means, means connected through said housing and connected to the element farthest from said engaging means for interconnecting said filtered signal to the input of said down converter, and means connected to the output of said down converter and to said engaging means for delivering said electrical signal output from said watertight housing.

3. An integrated down converter interdigital filter apparatus receptive of a microwave signal for producing an electrical output signal in a predetermined bandwidth corresponding to said microwave signal comprising:

a watertight housing, said watertight housing comprising:

(a) a housing having one end open, (b) a gasket for sealing around said opening, and (c) a jack plate for engaging said gasket and said open end of said housing to provide a watertight seal for said housing, a printed circuit board, a down converter located on a first end of said board, an interdigital filter located on the second end of said board, said interdigital filter comprising:

(a) a ground plane conductive surface formed on said second end, (b) a conductive rectangular housing having its bottom open, said housing having said open bottom soldered to the upper surface of said conductive surface in order to fully enclose the interior of said housing in a conductive envelope whose potential is at ground, (c) one end of said housing being connected to said jack plate, (d) a plurality of elements spatially located in said housing for filtering said microwave signal in said predetermined bandwidth, and (e) means connected to said jack plate and to said connected end of said housing for interconnecting said microwave signal with the element nearest said jack plate, means connected through said housing and connected to the element farthest from said jack plate for interconnecting said filtered signal to the input of said down converter, and means connected to the output of said down converter and to said jack plate for delivering said electrical signal output from said watertight housing.

4. A method for construction of an integrated down converter interdigital filter apparatus for producing an electrical output signal in a predetermined bandwidth corresponding to the microwave signal input, said method comprising the steps of:

forming a conductive ground plane surface on the printed circuit board containing the down converter, cutting four sides of the housing for the interdigital filter from sheet metal as a single piece, said step of cutting also including the cutting of element connection holes, tuning screw holes, and two signal access holes, threading all of said tuning screw holes in aforesaid cut piece containing said four sides, forming the aforesaid cut piece containing said cut four sides into a rectangular housing having two elongated sides, an elongated top, and one end, said formed housing having an open elongated bottom and one open end, cutting one end of said housing for the interdigital filter from sheet metal as a single piece, the aforesaid step of cutting also including the cutting of the microwave connector hole, the rivet holes, and the printed circuit bolder slots, forming the aforesaid piece containing said cut end of said housing by bending the edges perpendicularly to said center portion, forming a plurality of tubular elements for said interdigital filter, each of said tubular elements having a formed annular region on one end thereof, affixing said annular region of each of said plurality of tubular elements in said cut element connection holes of said formed rectangular housing, mounting the tuning screws for each element in said cut tuning screw holes of said formed rectangular housing, affixing said cut end piece of said housing to said open end of said formed housing, mounting the microwave connector to the cut microwave connector hole in said cut end piece of said housing, connecting the microwave signal input of said microwave connector through the first cut signal access hole to the nearest affixed element in said formed housing, connecting the interdigital signal output from said formed housing through the second cut signal access hole to the nearest affixed element in said formed housing, affixing the open elongated bottom of said formed housing to said formed conductive ground plane surface of said printed circuit board, and connecting said interdigital signal output from said affixed housing to the input of said down converter.

5. A method for construction of an interdigital filter apparatus on the down converter printed circuit board for producing an electrical output signal in a predetermined bandwidth corresponding to the microwave signal input, said method comprising the steps of:

forming a conductive ground plane surface on said printed circuit board containing the down converter, cutting four sides of the housing for the interdigital filter from sheet metal as a single piece, said step of cutting also including the cutting of element connection holes, tuning screw holes, and two signal access holes, forming the aforesaid cut piece containing said cut four sides into a rectangular housing having two elongated sides, an elongated top, and one end, said formed housing having an open elongated bottom and one open end, cutting one end of said housing for the interdigital filter from sheet metal as a single piece, the aforesaid step of cutting also including the cutting of the microwave connector hole, the rivet holes, and the printed circuit holder slots, forming the aforesaid piece containing said cut end of said housing by bending the edges perpendicularly to said center portion, forming a plurality of tubular elements for said interdigital filter, each of said tubular elements having a formed annular region on one end thereof, affixing said annular region of each of said plurality of tubular elements in said cut element connection holes of said formed rectangular housing, mounting the tuning screws for each element in said cut tuning screw holes of said formed rectangular housing, affixing said cut end piece of said housing to said open end of said formed housing, and affixing the open elongated bottom of said formed housing to said formed conductive ground plane surface of said printed circuit board.

* * * * *